United States Patent
Kim et al.

(10) Patent No.: US 11,784,249 B2
(45) Date of Patent: Oct. 10, 2023

(54) ACTIVE ANTENNA DEVICE BASED ON SILICON RING FIELD EFFECT TRANSISTOR ARRAY

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); E San Jang, Ulsan (KR); Min Woo Ryu, Ulsan (KR); Sang Hyo Ahn, Ulsan (KR)

(73) Assignee: ULSAN NATIONAL INSTITUTE OF SCIENCE AND TECHNOLOGY, Ulsan (KR)

( * ) Notice: Subject to any disclaimer, the term of this patent is extended or adjusted under 35 U.S.C. 154(b) by 57 days.

(21) Appl. No.: 17/636,666

(22) PCT Filed: Sep. 7, 2021

(86) PCT No.: PCT/KR2021/012114
§ 371 (c)(1),
(2) Date: Feb. 18, 2022

(87) PCT Pub. No.: WO2022/050816
PCT Pub. Date: Mar. 10, 2022

(65) Prior Publication Data
US 2022/0271160 A1     Aug. 25, 2022

(30) Foreign Application Priority Data
Sep. 7, 2020   (KR) .......................... 10-2020-0113599

(51) Int. Cl.
*H01L 29/78*     (2006.01)
*H01L 23/66*     (2006.01)
(Continued)

(52) U.S. Cl.
CPC .......... *H01L 29/7831* (2013.01); *H01L 23/66* (2013.01); *H01L 29/0607* (2013.01); *H01L 29/0847* (2013.01)

(58) Field of Classification Search
None
See application file for complete search history.

(56) References Cited

U.S. PATENT DOCUMENTS

2017/0358840 A1*   12/2017   Kim .................... H01L 29/7835
2018/0122912 A1*   5/2018    Kim .................... H01L 29/4238

FOREIGN PATENT DOCUMENTS

CN   107342316 A   11/2017
JP   2011-528499 A  11/2011
(Continued)

OTHER PUBLICATIONS

L. Crespi, T. Kodera, S. Oda and Y. Kawano, "Terahertz radiation detection through a micro-scale antenna and a silicon-based quantum dot," 2012 37th International Conference on Infrared, Millimeter, and Terahertz Waves, Wollongong, NSW, Australia, 2012, pp. 1-2, doi: 10.1109/IRMMW-THz.2012.6380268. (Year: 2012).*

(Continued)

*Primary Examiner* — Cory W Eskridge
(74) *Attorney, Agent, or Firm* — Osha Bergman Watanabe & Burton LLP

(57) ABSTRACT

An antenna device according to an example embodiment includes a silicon substrate of first type doping, at least two first doped regions formed by second type doping different from the first type doping, a second doped region formed by the second type doping outside a channel region surrounding the at least two first doped regions, and at least two gates disposed on a dielectric layer. In the antenna device, a resonant frequency is adjusted according to an external voltage individually applied to the at least two gates, and polarization information of a terahertz (THz) light source is (Continued)

obtained based on a pattern and an amount of an electric field measured at the at least two gates.

12 Claims, 13 Drawing Sheets

(51) Int. Cl.
*H01L 29/06* (2006.01)
*H01L 29/08* (2006.01)

(56) References Cited

FOREIGN PATENT DOCUMENTS

| | | | |
|---|---|---|---|
| KR | 10-2007-0035492 A | 3/2007 | |
| KR | 10-2013-0133368 A | 12/2013 | |
| KR | 10-2017-0080010 A | 7/2017 | |
| KR | 10-1804362 B1 | 12/2017 | |
| WO | WO-2017115896 A1 * | 7/2017 | ......... H01L 29/0847 |

OTHER PUBLICATIONS

International Search Report issued in corresponding International Application No. PCT/KR2021/012114 dated Dec. 24, 2021 (3 pages).
Written Opinion issued in corresponding International Application No. PCT/KR2021/012114 dated Dec. 24, 2021 (4 pages).

* cited by examiner

800 l=0, m=1 l=1, m=1 l=2, m=1 l=0, m=2 l=3, m=1 l=1, m=2 l=4, m=1 l=2, m=2 l=0, m=3 l=5, m=1 l=3, m=2 l=1, m=3

1201

ACTIVE ANTENNA DEVICE BASED ON SILICON RING FIELD EFFECT TRANSISTOR ARRAY

TECHNICAL FIELD

The present disclosure relates to a terahertz (THz) detector using a field-effect transistor (FET), and more particularly, to a THz detector for detecting a THz electromagnetic wave using an FET of a gate array.

BACKGROUND ART

In general, a terahertz (THz) electromagnetic wave detector based on a field-effect transistor (FET) concentrates a THz electromagnetic wave, which is an alternating current (AC) signal, between a gate and a source among three connecting terminals (a source, a drain, and a gate) of the FET. Also, the THz electromagnetic wave detector based on the FET may induce asymmetry in a quantity of electric charges in a lower semiconductor channel region between the source and the drain, detect a photoresponse using a direct current (DC) voltage of the drain, which is an output port, by an asymmetric distribution of the electric charges, and thereby detect a THz electromagnetic wave signal.

DISCLOSURE OF INVENTION

Technical Solutions

According to an aspect, there is provided an antenna device including a silicon substrate of first type doping, at least two first doped regions formed by a second type doping different from the first type doping in the silicon substrate, a second doped region formed by the second type doping outside a channel region in a form surrounding the at least two first doped regions when viewed from a direction perpendicular to the silicon substrate, and at least two gates disposed to correspond to the channel region and to be spaced apart from the silicon substrate, on a dielectric layer formed on a surface of the silicon substrate, in which the at least two first doped regions and the second doped region may absorb an electromagnetic wave in a certain frequency band of a terahertz (THz) electromagnetic wave in response to the at least two first gates receiving the THz electromagnetic wave.

According to another aspect, there is provided an antenna device in which the at least two first doped regions may be one of source regions and drain regions, and the second doped region may be the remainder doped region.

According to another aspect, there is provided an antenna device in which the first type doping may be either n-type doping or p-type doping, and the second type doping may be doping of the other type.

According to another aspect, there is provided an antenna device in which the certain frequency band may be determined based on a resonant frequency of the antenna device.

According to another aspect, there is provided an antenna device in which each center of the at least two first doped regions and each center of a channel region surrounding each of the at least two first doped regions may be isolated from each other.

According to another aspect, there is provided an antenna device in which the at least two first doped regions may be in a circular form and the at least two gates may be in a ring form when viewed from a direction perpendicular to the silicon substrate.

According to another aspect, there is provided an antenna device in which the at least two gates may be formed as a region covering the channel region when viewed from a direction perpendicular to the silicon substrate.

According to another aspect, there is provided an antenna device in which a resonant frequency of the antenna device may be adjusted according to an external voltage applied to the at least two gates.

According to another aspect, there is provided an antenna device in which the at least two first doped regions and the second doped region may absorb a THz electromagnetic wave when the at least two gates receive the THz electromagnetic wave and by that an electric field may be formed on a surface of the silicon substrate.

According to another aspect, there is provided an antenna device in which a pattern and an amount of an electric field measured at the at least two gates may change according to a polarization of a THz light source.

According to another aspect, there is provided an antenna device in which the at least two gates may be disposed to be spaced apart from each other along one of a virtual lattice in the second doped region and a circumference of the second doped region when viewed from a direction perpendicular to the silicon substrate.

According to another aspect, there is provided an antenna device in which the second doped region may be one of a region including a pair of sectors connected face to face, a circular region, a polygonal region, and an ellipse region when viewed from a direction perpendicular to the silicon substrate.

BEST MODE FOR CARRYING OUT THE INVENTION

Figure 1:
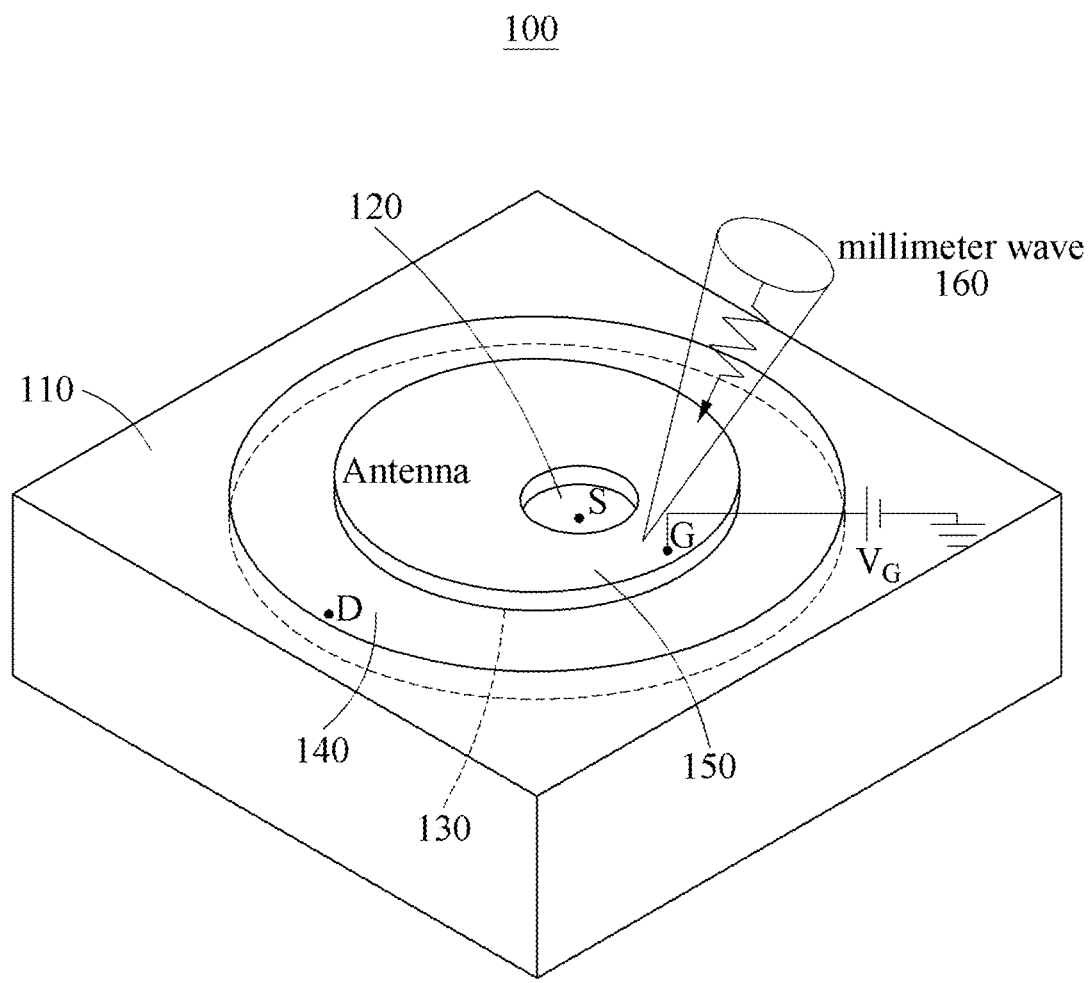
FIG. 1 is a side view illustrating a field-effect transistor (FET) in a ring form according to an example embodiment.

Hereinafter, example embodiments will be described in detail with reference to the accompanying drawings. However, various modifications may be made to the example embodiments. The example embodiments should be understood to include all changes, equivalents, and replacements within the idea and the technical scope of the disclosure.

The terminology used herein is for the purpose of describing particular example embodiments only and is not to be limiting of the example embodiments. The singular forms "a", "an", and "the" are intended to include the plural forms as well, unless the context clearly indicates otherwise. It will be further understood that the terms "comprises/comprising" and/or "includes/including" when used herein, specify the presence of stated features, integers, steps, operations, elements, and/or components, but do not preclude the presence or addition of one or more other features, integers, steps, operations, elements, components and/or groups thereof.

Unless otherwise defined, all terms including technical and scientific terms used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

When describing the example embodiments with reference to the accompanying drawings, like reference numerals refer to like constituent elements and a repeated description related thereto will be omitted. In the description of example embodiments, detailed description of well-known related structures or functions will be omitted when it is deemed that such description will cause ambiguous interpretation of the present disclosure.

Also, in the description of the components, terms such as first, second, A, B, (a), (b) or the like may be used herein when describing components of the present disclosure. These terms are used only for the purpose of discriminating one constituent element from another constituent element, and the nature, the sequences, or the orders of the constituent elements are not limited by the terms. When one constituent element is described as being "connected", "coupled", or "attached" to another constituent element, it should be understood that one constituent element can be connected or attached directly to another constituent element, and an intervening constituent element can also be "connected", "coupled", or "attached" to the constituent elements.

The same name may be used to describe an element included in the example embodiments described above and an element having a common function. Unless otherwise defined herein, the descriptions of the example embodiments may be applicable to the following example embodiments and a repeated description related thereto will be omitted for conciseness.

Hereinafter, desirable example embodiments according to the present disclosure will be described in detail with reference to the accompanying drawings.

FIG. 1 is a side view illustrating a field-effect transistor (FET) in a ring form according to an example embodiment.

A ring-formed FET for detecting a terahertz (THz) wave using a gate metal as an antenna will be described with reference to FIG. 1. As illustrated in FIG. 1, an antenna device 100 may include a source 120, a channel region 130, a drain 140, and a gate 150 formed in a silicon substrate 110. The channel region 130 may be a region including a channel which is a path of electric charges moving between a drain and a source.

The silicon substrate 110 of the antenna device 100 may be doped through first type doping. The source 120 of the antenna device 100 may be formed by second type doping different from the first type doping in the silicon substrate 110 of the first type doping. The channel region 130 may be in a form surrounding the source 120 when viewed from a direction perpendicular to the silicon substrate 110. Also, the drain 140 may be formed by the second type doping outside the channel region 130 in a form surrounding the source 120. In this case, the source 120 may be in a circular form when viewed from a direction perpendicular to the silicon substrate. Also, the drain 140 may be in a ring form when viewed from a direction perpendicular to the silicon substrate 110. The first type doping may be either n-type doping or p-type doping, and the second type doping may be doping of the other type.

A dielectric layer may be formed on the source 120, the channel region 130, and the drain 140. The gate 150 may be disposed to be spaced apart from the silicon substrate 100 and to correspond to the channel region 130 on the dielectric layer formed on a surface of the silicon substrate 110. Also, the gate 150 may be disposed in a region including the channel region 130 when viewed from a direction perpendicular to the silicon substrate 110. In addition, a portion of the gate 150 may be configured to overlap with a portion of the source 120 and a portion of the drain 140 when viewed from a direction perpendicular to the silicon substrate 110.

The antenna device 100, which is a THz electromagnetic wave detector based on an FET, may receive a THz electromagnetic wave 160 through the gate 150. A signal of the THz electromagnetic wave 160 may be detected based on an electric current and voltage generated between the source 120 and the drain 140 of the antenna device 100. A THz electromagnetic wave signal may be an electromagnetic wave signal having a frequency between 0.3 through 3 THz, which may also be referred to as a THz wave.

Figure 2:
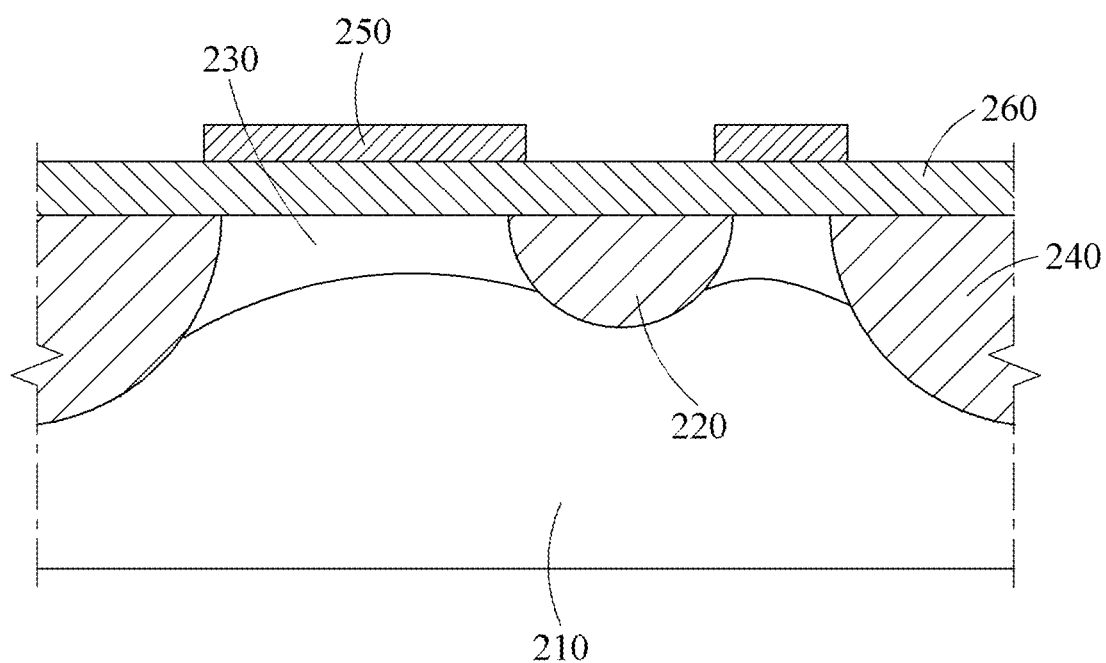
FIG. 2 is a cross-sectional view illustrating an FET in a ring form according to an example embodiment.

FIG. 2 is a cross-sectional view illustrating an FET in a ring form according to an example embodiment.

As described above with reference to FIG. 1, an antenna device 200 is an FET for detecting a THz wave in a ring form using a gate metal as an antenna. The antenna device 200 may include a silicon substrate 210 of first type doping, a source 220 formed by a second type doping in the silicon substrate 210, a drain 240 formed by the second type doping outside a channel region 230 in a form surrounding the source 220, and a gate 250 disposed on a dielectric layer 260 formed on a surface of the silicon substrate 210.

Figure 3:
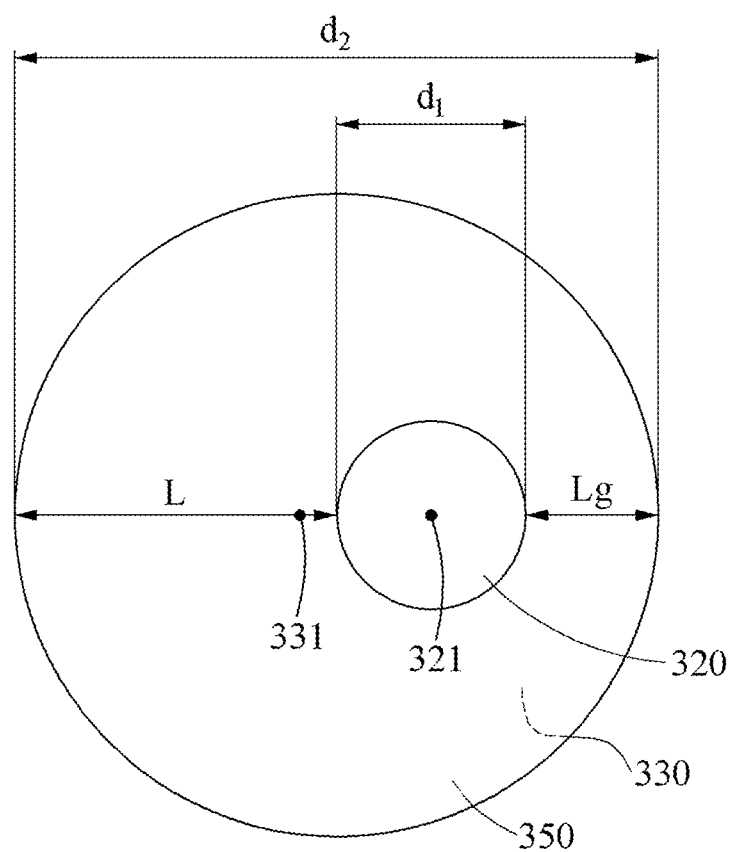
FIG. 3 is a top view illustrating an FET in a ring form according to an example embodiment.

FIG. 3 is a top view illustrating an FET in a ring form according to an example embodiment.

FIG. 3 is the top view illustrating an FET in a ring form in FIG. 1 when viewed from a direction perpendicular to a silicon substrate. As illustrated in FIG. 1, an antenna device 300 may include a source 320 and a channel region 330 surrounding the source 320. The source 320 may be formed as a circular region and a circumference of the channel region 330 may be in a circular form when viewed from a direction perpendicular to a silicon substrate. A center 321 of the source and a center 331 of the channel region may be eccentric in the antenna device 300. For example, when viewed from a direction perpendicular to the silicon substrate, the center 321 of the source and the center 331 of the channel region may be separate from each other in the antenna device 300, which maximizes asymmetry. In this example, when a diameter of the source 320 is d1, a diameter of the channel region 330 is d2, a shortest length between a circumference of the source 320 and a circumference of the channel region 330 is Lg, and a longest length between the circumference of the source 320 and the circumference of the channel region 330 is L, d2 is the same as the sum of d1, Lg, and L.

As described above, a virtual center 321 of the source and a virtual center 331 of the channel region may be separate from each other when viewed from a direction perpendicular to the silicon substrate. For example, a value of L and a value of Lg in the antenna device 300 may be different from each other. A range of an electric charge moving from the source 320 to a drain 340 may vary from Lg to L. The asymmetry described above may intensify an electric field between a gate 350 and the source 320 in the antenna device 300. The antenna device 300 may sensitively detect a THz electromagnetic wave based on a maximized photoresponse to a THz band through an asymmetric structure where a virtual center of a source and a virtual center of a channel region are eccentric.

Figure 4:
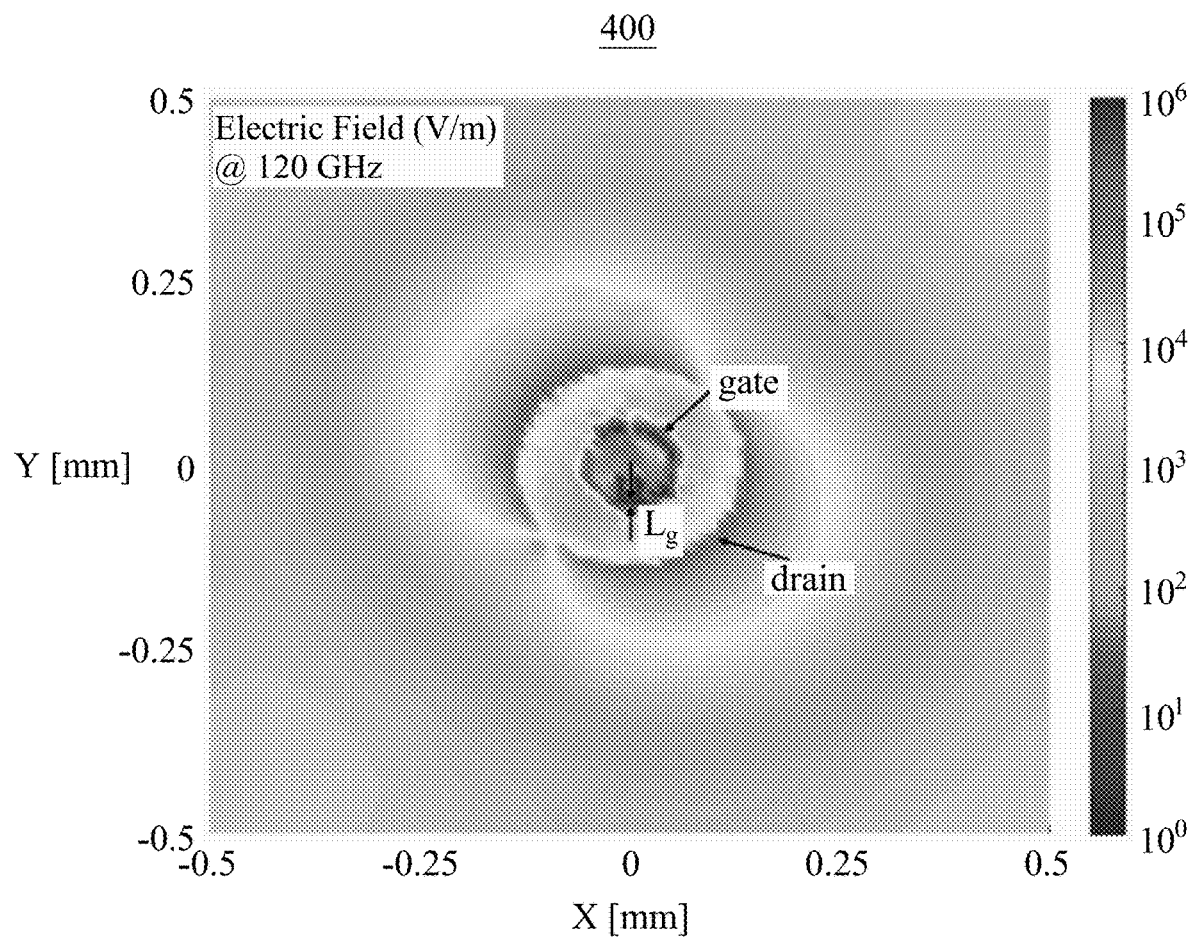
FIG. 4 is a diagram illustrating an electric field distribution on a surface of a silicon substrate when an antenna device absorbs a terahertz (THz) electromagnetic wave according to an example embodiment.

FIG. 4 is a diagram illustrating an electric field distribution on a surface of a silicon substrate when an antenna device absorbs a THz electromagnetic wave according to an example embodiment.

In response to the antenna device receiving a THz electromagnetic wave, a drain and a source may absorb an electromagnetic wave of a frequency band in the THz electromagnetic wave. When the antenna device absorbs the THz electromagnetic wave, an electric current and voltage may be generated in the source and the drain, and the electric field may be formed on the surface of the silicon substrate. For example, the antenna device may be excited by the THz electromagnetic wave received by a gate and an electric dipole moment may be generated around the drain.

Figure 5:
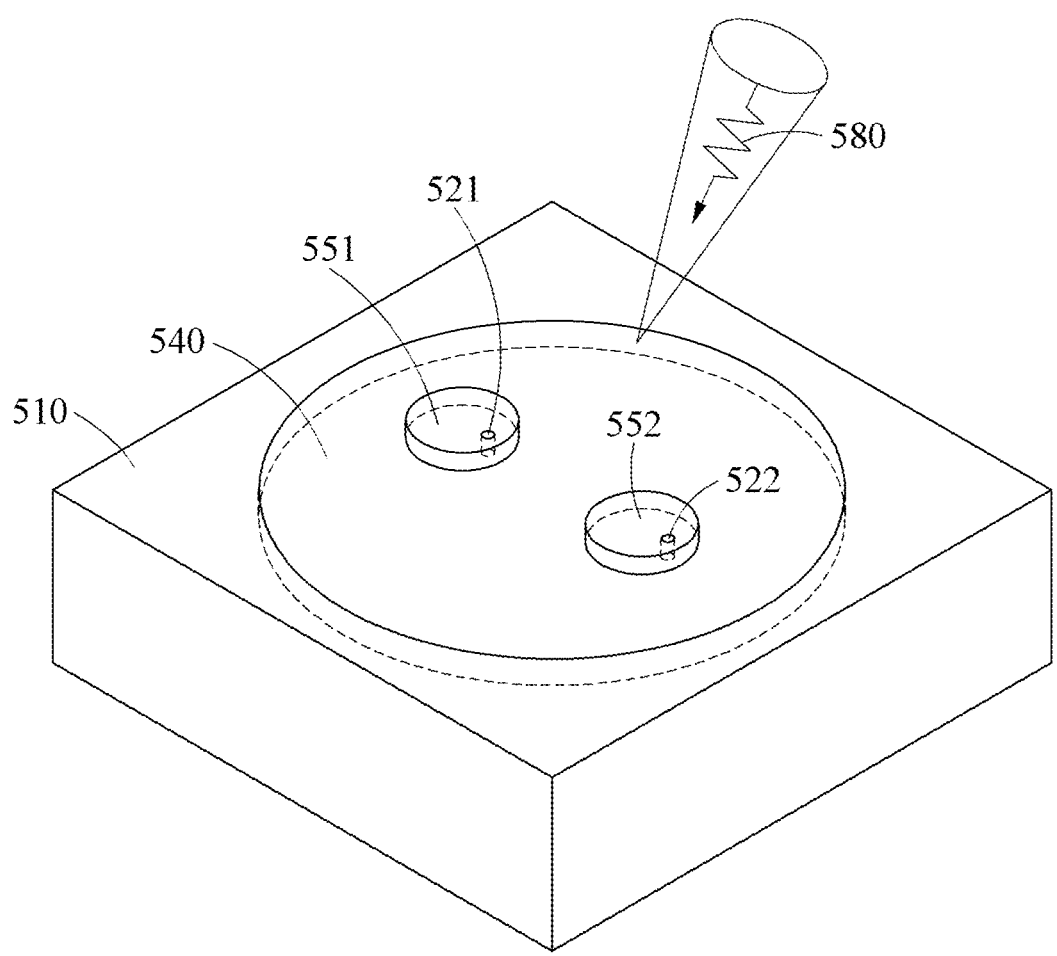
FIG. 5 is a diagram illustrating an antenna device according to an example embodiment.

FIG. 5 is a diagram illustrating an antenna device according to an example embodiment.

An antenna device 500 according to an example embodiment may be provided in a form of a multi-ring FET gate array. That is, the antenna device 500 may include at least two gates, and the at least two gates may be arranged in various arrangements.

The antenna device 500 may include two first doped regions 521 and 522 formed in a silicon substrate 510, a second doped region 540 formed outside a channel region in a form surrounding a source, and two gates 551 and 552 disposed to be spaced apart from the silicon substrate 510 and to correspond to the channel region, on a dielectric layer 560. Hereinafter, a structure of the antenna device 500 according to an example embodiment will be described in more detail.

A first doped region may be one of a source and a drain and a second doped region may correspond to the remainder. For example, when the first doped region operates as the source, the second doped region may operate as the drain. When the first doped region operates as the drain, the second doped region may operate as the source. The following description is provided based on an example where the first doped region operates as the source and the second doped region operates as the drain in the antenna device 500. However, examples are not limited to the foregoing example, and the first doped region may operate as the drain and the second doped region may operate as the source in the antenna device 500.

The silicon substrate 510 of the antenna device 500 may be doped through first type doping. Also, a first source 521 and a second source 522 of the antenna device 500 may be formed by second type doping different from the first type doping. In this case, the first source 521 and the second source 522 of the antenna device 500 may be formed to be separate from each other. For example, the first source 521 and the second source 522 may be formed on the silicon substrate 510 in such a way that a channel region surrounding the first source 521 and a channel region surrounding the second source 522 may not overlap each other. The first source 521 and the second source 522 may be in a circular form when viewed from a direction perpendicular to the silicon substrate 510.

A drain 540 of the antenna device 500 may be formed by the second type doping outside a channel region in a form surrounding the first source 521 and the second source 522 when viewed from a direction perpendicular to the silicon substrate 510. As illustrated in FIG. 4, when viewed from a direction perpendicular to the silicon substrate 510, the drain 540 may be in a circular form, but is not limited thereto. The drain 540 may be one of a region including a pair of sectors connected face to face, a polygonal region, and a ellipse region. This will be described further below with reference to FIGS. 11 through 12B.

In the antenna device 500, the dielectric layer 560 may be formed on a region of the first source 521, a region of the second source 522, the channel region, and a region of the drain 540. That is, in the antenna device 500, the dielectric layer 560 may be formed on a surface of the silicon substrate 510. For example, the dielectric layer 560 may be formed with an oxide such as a silicon oxide (e.g., silicon dioxide).

A first gate 551 and a second gate 552 of the antenna device 500 may be disposed on the dielectric layer 560 formed on the surface of the silicon substrate 510. The first gate 551 and the second gate 552 may be disposed to be spaced apart from the silicon substrate 510 and to correspond to the channel region. The first gate 551 and the second gate 552 may be in a ring form when viewed from a direction perpendicular to the silicon substrate 510. For example, when viewed from a direction perpendicular to the silicon substrate 510, the first gate 551 may be formed as a region covering the channel region surrounding the first source 521 and the second gate 552 may be formed as a region covering the channel region surrounding the second source 522. Alternatively, when viewed from a direction perpendicular to the silicon substrate 510, the first gate 551 may be formed as a region matching the channel region surrounding the first source 521 and the second gate 552 may be formed as a region matching the channel region surrounding the second source 522.

In addition, when viewed from a direction perpendicular to the silicon substrate 510, the first gate 551 and the second gate 552 of the antenna device 500 may be disposed, overlapping with a portion of a source and a drain while including the channel region. For example, when viewed from a direction perpendicular to the silicon substrate 510, a portion of the first gate 551 may be formed overlapping with a portion of the first source 521 and a portion of the drain 540 and a portion of the second gate 552 may be formed overlapping with a portion of the second source 522 and a portion of the drain 540. As described above, a structure of the antenna device 500 in which a drain and a source overlap may further increase asymmetry of the antenna device 500.

Also, in the antenna device 500, a virtual center of the first source 521 and a virtual center of the channel region surrounding the first source 521 may be separate from each other. Similarly, a virtual center of the second source 522 and a virtual center of the channel region surrounding the second source 522 may also be separate from each other. An eccentric direction between a center of a first source and a center of a channel region and an eccentric direction between a center of a second source and the center of the channel region may be the same.

A THz electromagnetic wave 580 may be applied to the antenna device 500. The first gate 551 and the second gate 552 of the antenna device 500 according to an example embodiment may receive the THz electromagnetic wave 580, and the drain 540 and sources 521 and 522 may absorb an electromagnetic wave of a frequency band in the THz electromagnetic wave. The frequency band of the THz electromagnetic wave absorbed by the antenna device 500 may be determined based on a resonant frequency of the antenna device 500.

An antenna device of an FET including one or more gates may have a resonant frequency. The resonant frequency of the antenna may be represented as a capacitance element and an inductance element in Equation 1.

$$f = \frac{1}{2\pi\sqrt{LC}} \quad \text{[Equation 1]}$$

In Equation 1, f denotes a resonant frequency of an antenna included in a biometric sensor using an electromagnetic wave, L denotes an inductance of the antenna, and C denotes a capacitance of the antenna. Doped regions of the antenna device of the FET including one or more gates may operate as a dipole antenna.

Although FIG. 5 illustrates an antenna device including two gates, examples are not limited thereto, and the antenna device may include two or more gates. The antenna device may include a silicon substrate of first type doping, at least two first doped regions formed in the silicon substrate by second type doping different from the first type doping, a second doped region formed by the second type doping outside a channel region in a form surrounding the at least two first doped regions when viewed from a direction perpendicular to the silicon substrate, at least two gates disposed to be spaced apart from the silicon substrate and to correspond to the channel region, on a dielectric layer formed on a surface of the silicon substrate. In this case, in the antenna device, a virtual center of each of the at least two first doped regions and a center of a channel region surrounding each of the at least two first doped regions may be separate from each other. Also, when the at least two gates of the antenna device receive a THz electromagnetic wave, the at least two first doped regions and the second doped region may absorb an electromagnetic wave of a frequency band in the THz electromagnetic wave. An arrangement of at least two gate arrays of the antenna device will be described with reference to FIGS. 9 and 10.

Figure 6:
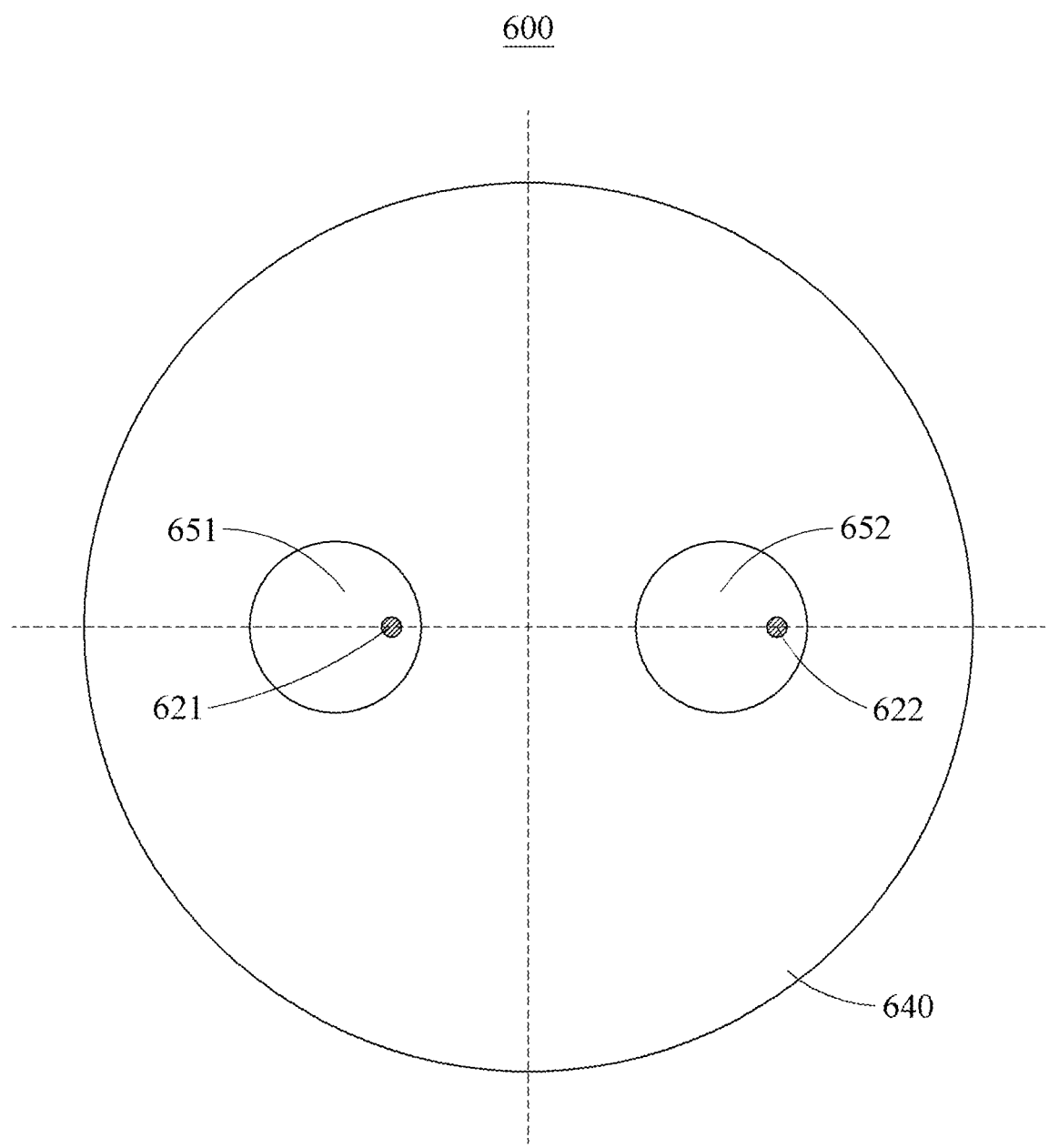
FIG. 6 is a top view illustrating an antenna device according to an example embodiment.

FIG. 6 is a top view illustrating an antenna device according to an example embodiment.

FIG. 6 is a top view of an antenna device including multiple gate arrays of FIG. 5 when viewed from a direction perpendicular to a silicon substrate. As illustrated in FIG. 5, an antenna device 600 may include two first doped regions 621 and 622 formed in the silicon substrate, second type doped region 640 formed outside a channel region surrounding each of the first doped regions, and two gates 651 and 652 disposed on a dielectric layer to be spaced apart from the silicon substrate.

Figure 7:
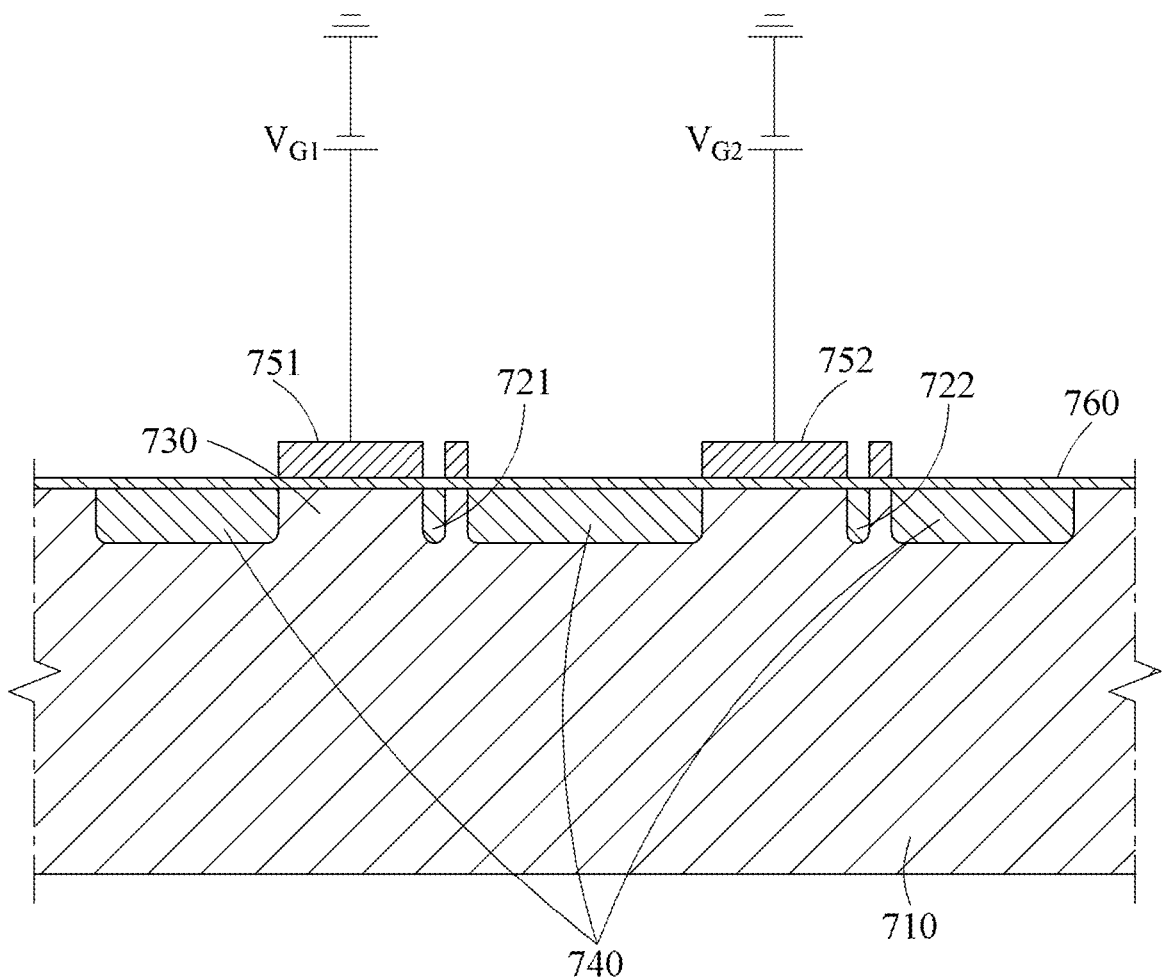
FIG. 7 is a diagram illustrating an antenna device in which an external voltage is individually applied to gates according to an example embodiment.

FIG. 7 is a diagram illustrating an antenna device in which an external voltage is individually applied to gates according to an example embodiment.

FIG. 7 is a cross-sectional view of an antenna device including a plurality of gate arrays of FIG. 5. As illustrated in FIG. 5, an antenna device 700 may include two first doped regions 721 and 722 formed in a silicon substrate 710, a second type doped region 740 formed outside a channel region 730 in a form surrounding a first doped region, and a first gate 751 and a second gate 752 disposed on a dielectric layer 760 to be spaced apart from the silicon substrate 710. In this case, an external voltage $V_{G1}$ and an external voltage $V_{G2}$ may be applied to the first gate 751 of the antenna device 700 according to an example embodiment and an external voltage $V_{G2}$ may be individually applied to the second gate 752.

For example, the silicon substrate 710 of the antenna device 700 may be doped through p-type doping. In this case, when voltage greater than or equal to a threshold voltage is applied to the first gate 751 of the antenna device, an electric current may not flow from a first source 721 to a channel region surrounding the first source 721. Also, when voltage less than the threshold voltage is applied to the first gate 751 of the antenna device 700, an electric current may flow from the first source 721 to the channel region surrounding the first source 721. That is, when voltage less than the threshold voltage is applied to a gate in the antenna device 700 of which a silicon substrate is doped through p-type doping, the gate, which is a THz detector, may operate. Conversely, when voltage greater than or equal to the threshold voltage is applied to the gate in the antenna device 700 of which the silicon substrate is doped through the p-type doping, the THz detector may stop operating. The first gate 751 and the second gate 752 of the antenna device 700 may or may not operate individually according to the external voltages $V_{G1}$ and $V_{G2}$ respectively applied thereto.

Based on a pattern of an external voltage applied to each gate of the antenna device 700, a characteristic impedance of the antenna device 700 may be determined. For example, the characteristic impedance may represent a ratio between a voltage wave and a current wave and may be represented as Equation 2.

$$Z = \frac{R + jwL}{G + jwC} \quad \text{[Equation 2]}$$

In Equation 2, R denotes a resistance of an antenna, L denotes an inductance of the antenna, C denotes a capacitance of the antenna, G denotes a conductance of the antenna, and w denotes an angular velocity of an electromagnetic wave.

The characteristic impedance of the antenna device 700 may be adjusted according to an external voltage individually applied to the first gate 751 and the second gate 752. Based on the characteristic impedance of the antenna device 700, a resonant frequency of the antenna device 700 may be determined. That is, the antenna device 700 may individually apply an external voltage to each gate and may thereby change the characteristic impedance of the antenna device 700. The antenna device 700 may absorb an electromagnetic wave in an impedance matched frequency band of an applied THz electromagnetic wave. In the antenna device 700, the resonant frequency may be adjusted according to external voltages applied to the two gates.

Similarly in an antenna device including two or more gates according to an example embodiment, an external voltage may be individually applied to each of the gates. Also, based on a pattern of the external voltage applied to the gates of the antenna device, a characteristic resistance of the antenna device may be adjusted. Based on the determined characteristic resistance of the antenna device, the resonant frequency of the antenna device may be determined.

Figure 8:
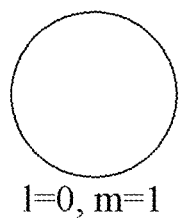
FIG. 8 is a diagram illustrating an electric field pattern according to a waveguide mode of a THz electromagnetic wave according to an example embodiment.
Figure 8:
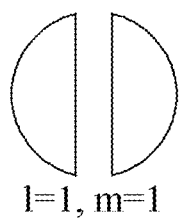
Figure 8:
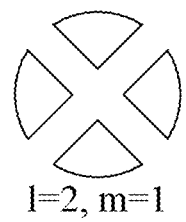
Figure 8:
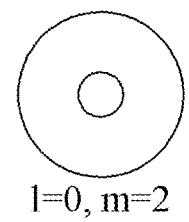
Figure 8:
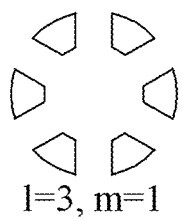
Figure 8:
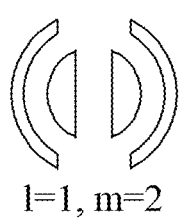
Figure 8:
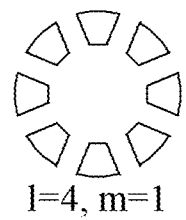
Figure 8:
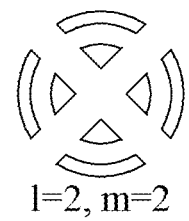
Figure 8:
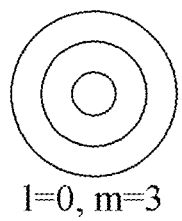
Figure 8:
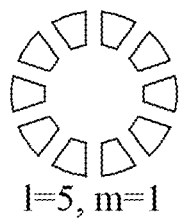
Figure 8:
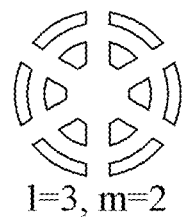
Figure 8:

FIG. 8 is a diagram illustrating an electric field pattern according to a waveguide mode of a THz electromagnetic wave according to an example embodiment.

An electric field pattern 800 in FIG. 8 may be an electric field pattern according to a waveguide mode of a light source for a THz electromagnetic wave to be absorbed. For example, the electric field pattern 800 may represent an electric field pattern in a transverse (TE) mode of the THz electromagnetic wave light source. Here, 1 and m may represent a mode coefficient.

An antenna device including at least two gates according to an example embodiment may be used to obtain polarization information of a light source for a concentrated THz electromagnetic wave. The polarization information of the THz electromagnetic wave refers to information associated with polarization of the THz electromagnetic wave. The polarization information also refers to information on the vibration of an electric or magnetic field of an electromagnetic wave in a specific direction during the travel of the electromagnetic wave.

The antenna device may receive a THz electromagnetic wave through a gate, and a source and a drain may absorb the THz electromagnetic wave having a waveguide mode.

When the at least two gates receive a THz electromagnetic wave, at least two first doped regions and a second doped region of the antenna device may absorb the THz electromagnetic wave, and an electric field may thus be formed on a surface of a silicon substrate. In this case, positions of the at least two gates of the antenna device on the surface of the silicon substrate may be different from each other, and an intensity of an electric field measured at each of the gates may thus be different from each other. Therefore, an intensity of an electric field may be measured at each gate, and a pattern of the electric field of the THz electromagnetic wave of the antenna device may thereby be obtained.

The polarization information of the THz light source may be obtained based on the pattern and the amount of the electric field measured at the at least two gates of the antenna device. That is, the pattern and the amount of the electric field measured by the gates of the antenna device may change according to the polarization information of the THz electromagnetic wave light source, and the polarization information of the THz light source may be obtained based on the pattern and the amount of the electric field formed or measured at the gates. Specifically, the polarization information of the THz light source may be obtained through a comparison between the electric field pattern measured at the at least two gates of the antenna device absorbing the THz electromagnetic wave and the electric field pattern 800 according to a waveguide mode of the THz electromagnetic wave.

The antenna device may determine a waveguide mode of the THz electromagnetic wave through the comparison with the electric field pattern 800 according to the waveguide mode of the THz electromagnetic wave based on an intensity distribution of an electric field formed at each gate.

Figure 9:
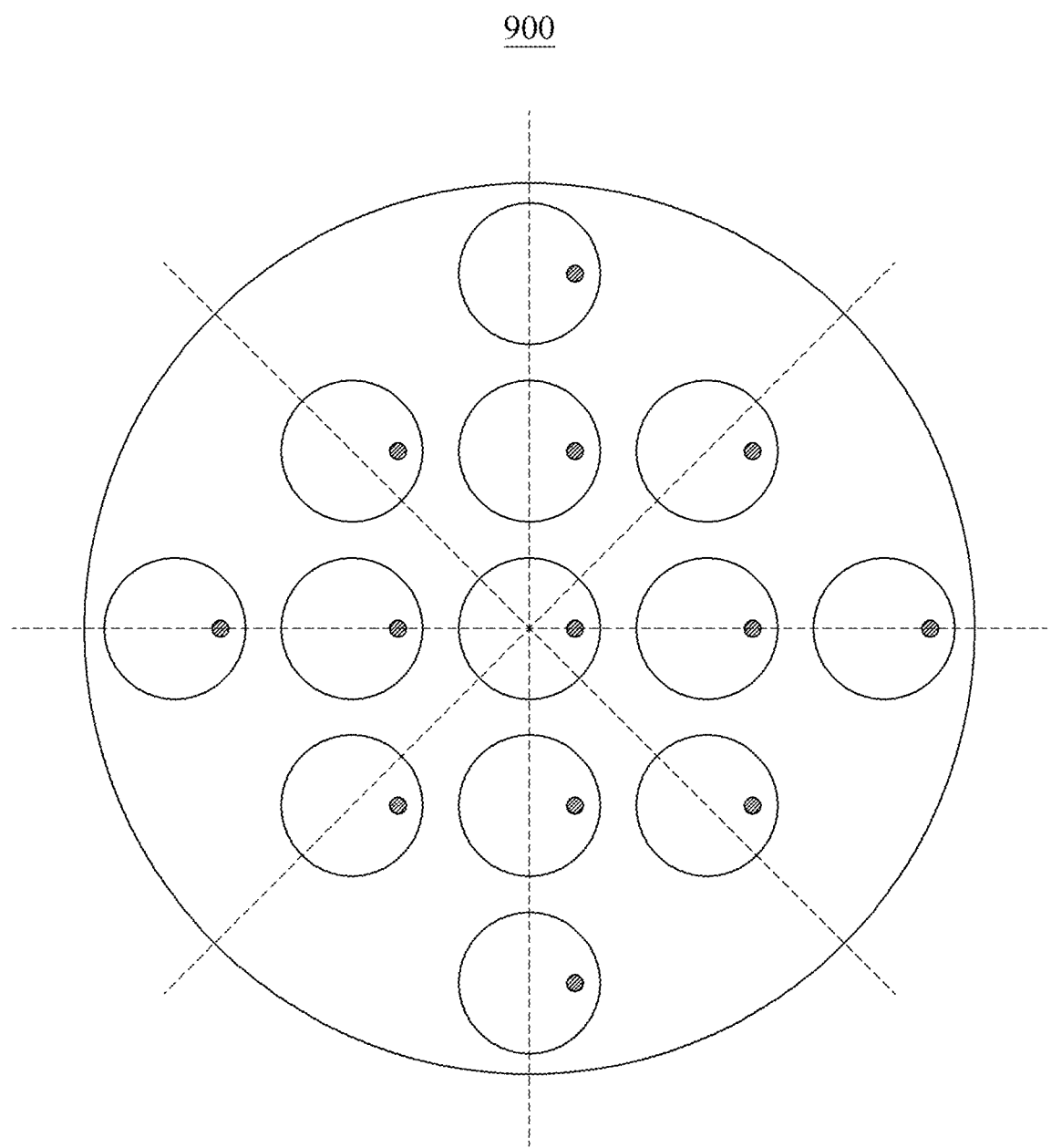
FIGS. 9 and 10 are diagrams illustrating example arrangements of two or more gates of an antenna device in a drain region according to an example embodiment.
Figure 10:
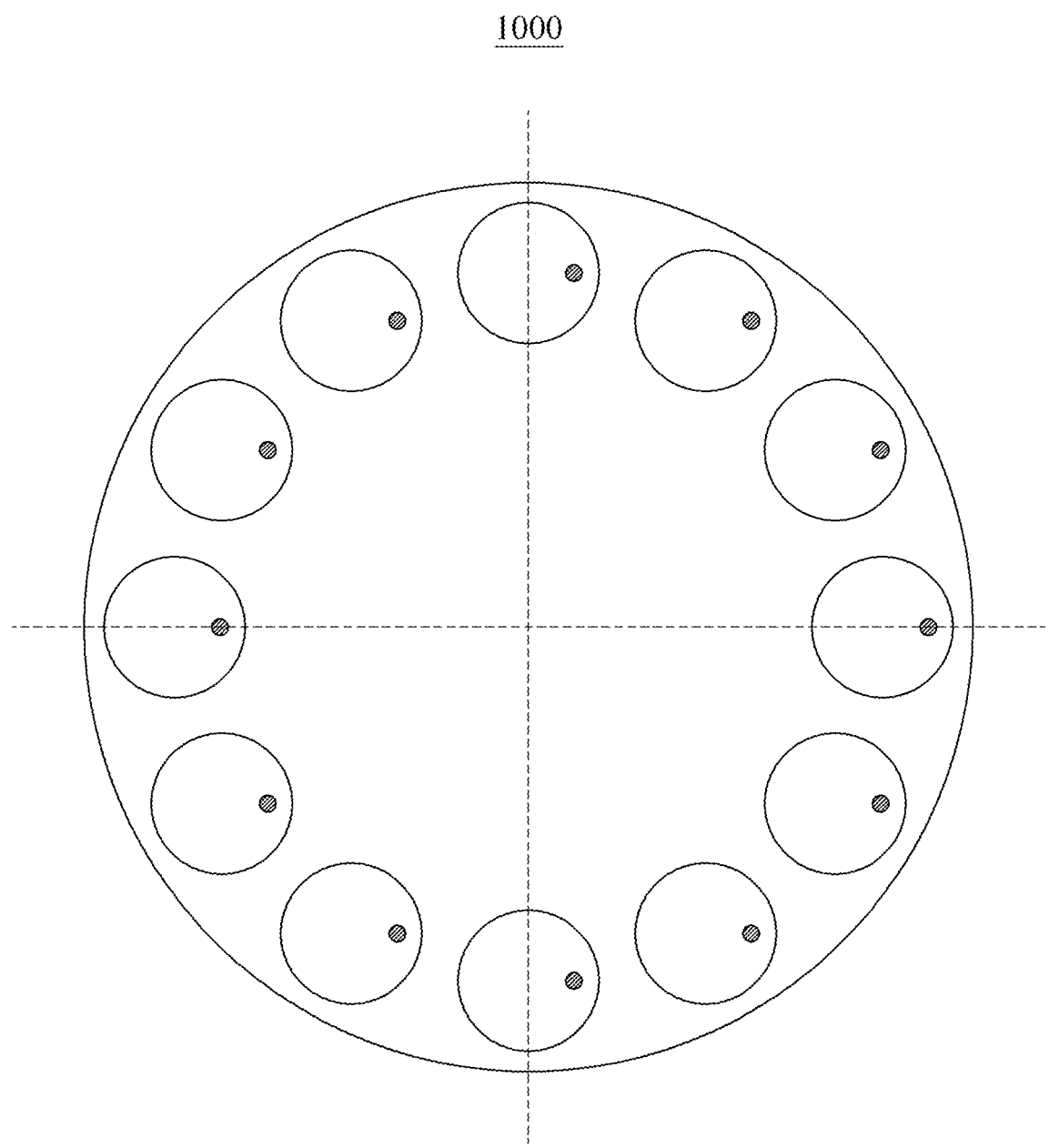

FIGS. 9 and 10 are diagrams illustrating example arrangements of two or more gates of an antenna device in a drain according to an example embodiment.

In FIG. 9, at least two gates of an antenna device 900 according to an example embodiment may be disposed to be spaced apart from each other along a virtual lattice in a second doped region when viewed from a direction perpendicular to a silicon substrate. For example, when viewed from a direction perpendicular to the silicon substrate, a portion of the at least two gates may be isolated from each other along a virtual first straight line across the second doped region, and another portion of the at least two gates may be spaced apart from each other along a second straight line intersecting the first straight line. For example, the first straight line may pass a center of the second doped region and the second straight line may be orthogonal to the second straight line at the center of the second doped region. In addition, still another portion of the at least two gates may be disposed to be spaced apart from each other along one or more third straight lines intersecting the first straight line and the second straight line. The first straight line, the second straight line, and the one or more third straight lines may form a lattice.

In FIG. 10, at least two gates of an antenna device 1000 according to an example embodiment may be disposed to be spaced apart from each other along a circumference of a second doped region when viewed from a perimeter direction to a silicon substrate.

In FIGS. 9 and 10, in the antenna device according to an example embodiment, each of virtual centers of at least two first doped regions and a virtual center of a channel region surrounding each of the at least two first doped regions may be separate from each other. For example, eccentric directions between the virtual centers of the at least two first doped regions and the center of the channel region may be the same.

Figure 11:
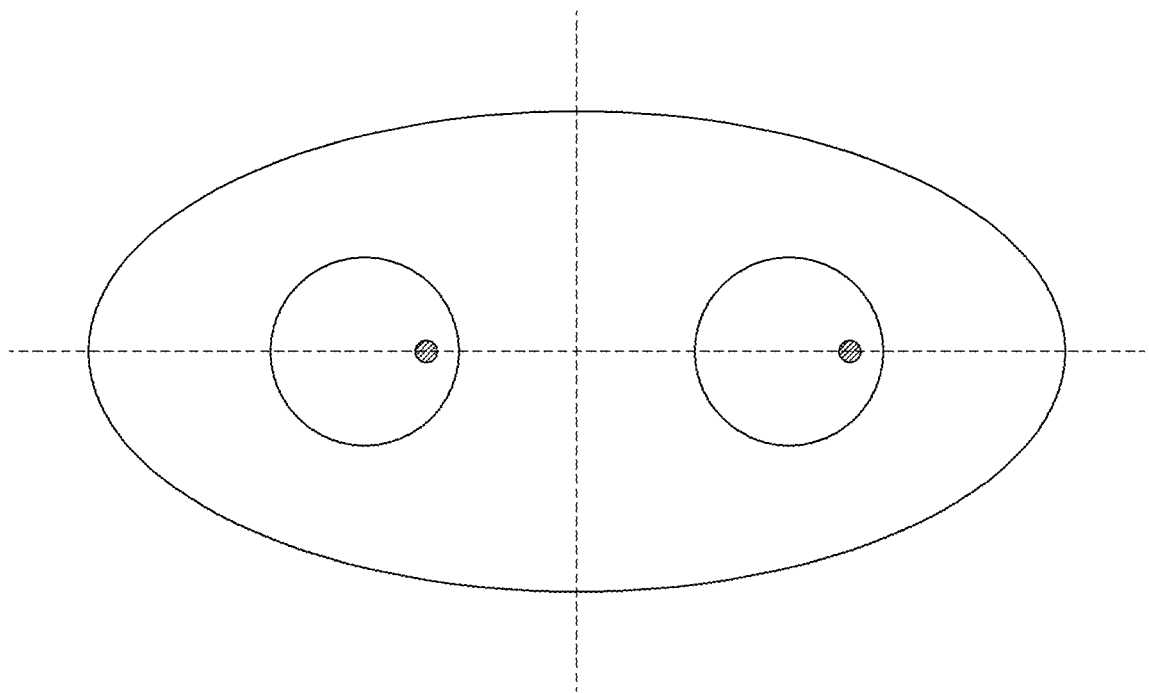
FIGS. 11 through 12 are diagrams illustrating example forms of a second doped region of an antenna device according to an example embodiment.
Figure 12A:
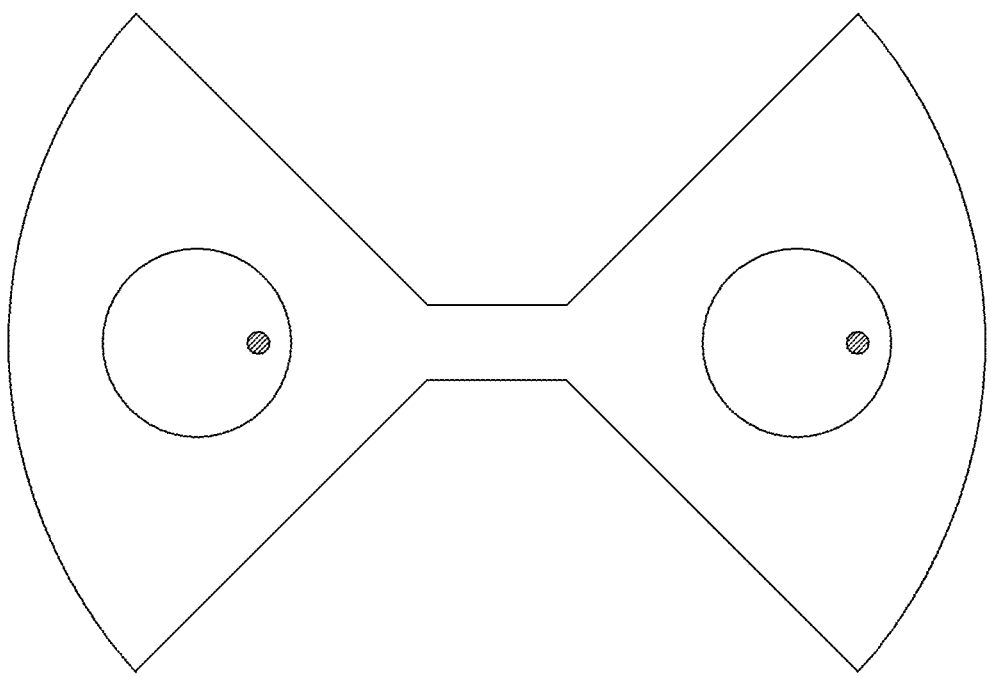
Figure 12B:
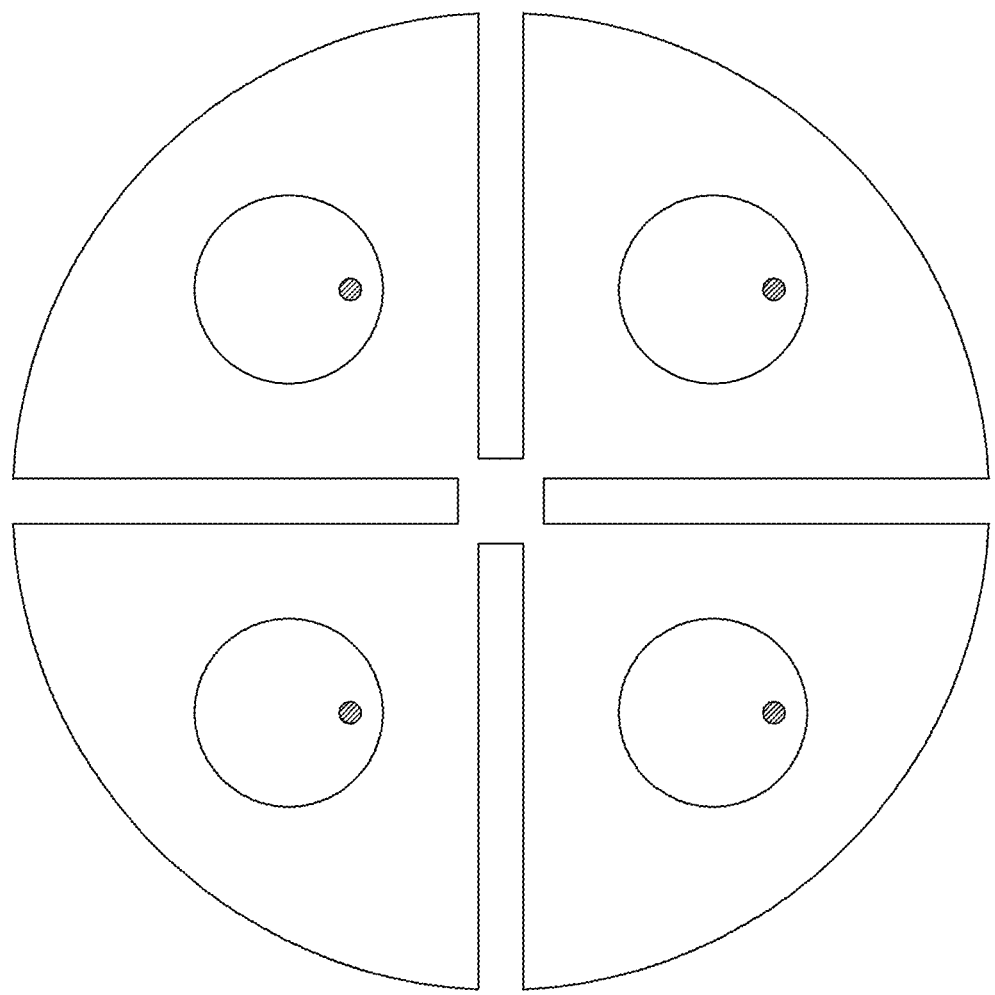

FIGS. 11 through 12B are diagrams illustrating a second doped region of an antenna device according to an example embodiment.

In FIG. 11, a second doped region of an antenna device 1100 according to an example embodiment may be an ellipse region when viewed from a direction perpendicular to a silicon substrate.

In FIG. 12A, a second doped region of an antenna device 1201 according to an example embodiment may be a region including a pair of sectors connected face to face when viewed from a direction perpendicular to a silicon substrate. In FIG. 12B, a second doped region of an antenna device 1202 according to an example embodiment may be a region including two pairs of sectors connected face to face when viewed from a direction perpendicular to a silicon substrate. In this case, the two pairs of sectors connected face to face may not intersect with each other.

An antenna device according to an example embodiment may absorb an electromagnetic wave of a frequency band in the THz electromagnetic wave according to a form of a second doped region. For example, when the second doped region of the antenna device is in a circular form, the antenna device may absorb a THz electromagnetic wave with a wavelength twice or quadruple the length of a diameter of the second doped region. For another example, when the second doped region of the antenna device is in an ellipse form, the antenna device may absorb a frequency band of a THz electromagnetic wave with a wavelength between one that is twice the length of a minor axis of the second doped region and one that is twice the length of a major axis of the second doped region, or with a wavelength between one that is quadruple the length of the minor axis and one that is quadruple the length of the major axis.

A number of example embodiments have been described above. Nevertheless, it should be understood that various modifications may be made to these example embodiments. Suitable results may be achieved if the described techniques are performed in a different order, and/or if components in a described system, architecture, device, or circuit are combined in a different manner, and/or replaced or supplemented by other components or their equivalents.

Accordingly, other implementations are within the scope of the following claims.

The invention claimed is:

1. An antenna device, comprising:
   a silicon substrate of first type doping;
   at least two first doped regions formed in the silicon substrate by second type doping different from the first type doping;
   a second doped region formed by the second type doping outside a channel region in a form surrounding the at least two first doped regions when viewed from a direction perpendicular to the silicon substrate; and
   at least two gates disposed to be spaced apart from the silicon substrate and to correspond to the channel region, on a dielectric layer formed on a surface of the silicon substrate,
   wherein
   when the at least two gates receive a terahertz (THz) electromagnetic wave, the at least two first doped regions and the second doped region absorb an electromagnetic wave of a frequency band in the THz electromagnetic wave.

2. The antenna device of claim 1, wherein
   the at least two first doped regions are one of a source and a drain, and
   the second doped region is the drain when the at least two first doped regions are the source and is the source when the at least two first doped regions are the drain.

3. The antenna device of claim 1, wherein
   the first type doping is one of n-type doping and p-type doping, and
   the second type doping is a remaining one of the n-type doping and the p-type doping.

4. The antenna device of claim 1, wherein
   the frequency band is
   determined based on a resonant frequency of the antenna device.

5. The antenna device of claim 1, wherein
   a center of each of the at least two first doped regions and a center of the channel region surrounding each of the at least two first doped regions are separate from each other.

6. The antenna device of claim 1, wherein
   the at least two first doped regions are each in a circular form and the at least two gates are each in a ring form when viewed from the direction perpendicular to the silicon substrate.

7. The antenna device of claim 1, wherein
   the at least two gates are formed as a region covering the channel region when viewed from the direction perpendicular to the silicon substrate.

8. The antenna device of claim 1, wherein
   a resonant frequency of the antenna device is adjusted according to an external voltage applied to the at least two gates.

9. The antenna device of claim 1, wherein
   when the at least two gates receive a THz electromagnetic wave, the at least two first doped regions and the second doped region absorb the THz electromagnetic wave and an electric field is formed on the surface of the silicon substrate.

10. The antenna device of claim 9, wherein
    a pattern and an amount of the electric field measured at the at least two gates change according to a polarization of a THz light source.

11. The antenna device of claim 1, wherein
    the at least two gates disposed to be spaced apart from each other along one of a virtual lattice in the second doped region and a circumference of the second doped region when viewed from the direction perpendicular to the silicon substrate.

12. The antenna device of claim 1, wherein
    the second doped region is one of a region comprising a pair of sectors connected face to face, a circular region, a polygonal region, and an ellipse region when viewed from the direction perpendicular to the silicon substrate.

* * * * *